(12) United States Patent
Park et al.

(10) Patent No.: US 11,393,990 B2
(45) Date of Patent: Jul. 19, 2022

(54) QUANTUM DOT LIGHT EMITTING DEVICE AND DISPLAY APPARATUS INCLUDING THE SAME

(71) Applicant: LG Display Co., Ltd., Seoul (KR)

(72) Inventors: Jaehyun Park, Seoul (KR); Somang Kim, Seoul (KR); Kyunam Kim, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 231 days.

(21) Appl. No.: 16/538,234

(22) Filed: Aug. 12, 2019

(65) Prior Publication Data

US 2020/0058884 A1 Feb. 20, 2020

(30) Foreign Application Priority Data

Aug. 14, 2018 (KR) ........................ 10-2018-0094938

(51) Int. Cl.
| | |
|---|---|
| *H01L 51/50* | (2006.01) |
| *H01L 51/00* | (2006.01) |
| *H01L 31/0256* | (2006.01) |

(52) U.S. Cl.
CPC ........ *H01L 51/0093* (2013.01); *H01L 51/005* (2013.01); *H01L 51/0035* (2013.01);
(Continued)

(58) Field of Classification Search
None
See application file for complete search history.

(56) References Cited

U.S. PATENT DOCUMENTS

| | | | |
|---|---|---|---|
| 2013/0009131 A1 | 1/2013 | Kazlas et al. | |
| 2015/0315460 A1* | 5/2015 | Gim et al. | C09K 11/06 428/690 |

(Continued)

FOREIGN PATENT DOCUMENTS

| | | |
|---|---|---|
| CN | 102903855 A | 1/2013 |
| CN | 104822798 A | 8/2015 |

(Continued)

OTHER PUBLICATIONS

Combined Search and Examination Report dated Jan. 22, 2020 issued in United Kingdom Patent Application No. 1911626.8 (7 pages).

(Continued)

*Primary Examiner* — Gregory D Clark
(74) *Attorney, Agent, or Firm* — Polsinelli PC

(57) ABSTRACT

Provided is a quantum dot light-emitting device and a display apparatus including the same. The quantum dot light-emitting device comprises: an anode; a cathode; a hole transport layer disposed between the anode and the cathode; a light-emitting layer disposed between the hole transport layer and the cathode, the light-emitting layer including a quantum dot having a core-shell structure; and a buffer layer disposed between the hole transport layer and the light-emitting layer, wherein the buffer layer contains an organic compound or derivatives thereof. The external quantum efficiency and device stability are improved. an aromatic hydrocarbon compound or derivatives thereof having a functional group selected from the group consisting of a hydroxyl group (—OH), a carboxyl group (—COOH), an amino group (—NR, —NH, —NH$_2$, where R is a C1 to C6 monovalent hydrocarbon group or derivatives thereof) and a thiol group (—SH).

17 Claims, 3 Drawing Sheets

(52) U.S. Cl.
CPC ...... *H01L 51/0037* (2013.01); *H01L 51/0042* (2013.01); *H01L 51/502* (2013.01); *H01L 51/5004* (2013.01); *H01L 51/50* (2013.01); *H01L 2031/0344* (2013.01); *H01L 2251/552* (2013.01); *H01L 2251/558* (2013.01)

(56) References Cited

U.S. PATENT DOCUMENTS

| | | |
|---|---|---|
| 2018/0138434 A1 | 5/2018 | Yoon et al. |
| 2018/0151630 A1 | 5/2018 | Yamaoka et al. |

FOREIGN PATENT DOCUMENTS

| | | |
|---|---|---|
| CN | 105261707 B | 1/2016 |
| CN | 106374051 A | 2/2017 |
| EP | 3327813 A1 | 5/2018 |
| JP | 2004359671 A1 | 12/2004 |
| KR | 10-1726630 B1 | 4/2017 |
| KR | 20180035278 A | 4/2018 |

OTHER PUBLICATIONS

Chinese Office Action dated Nov. 19, 2021 issued in Patent Application No. 201910747510.8 w/English Translation (19 pages).
German Office Action dated Jan. 26, 2022 issued in Patent Application No. 10 2019 121 867.5 w/English Translation (14 pages).

* cited by examiner

FIG. 5
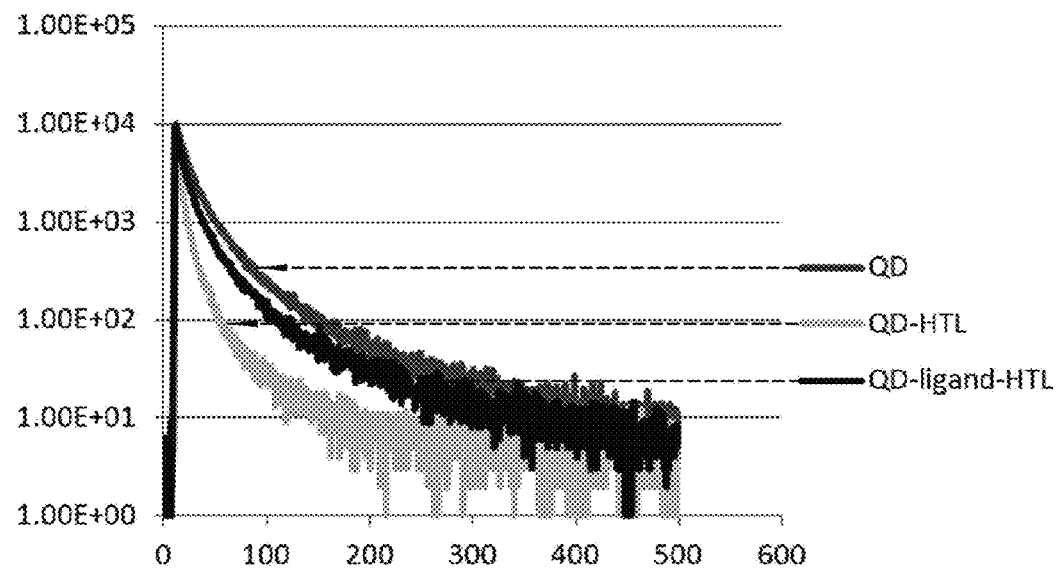
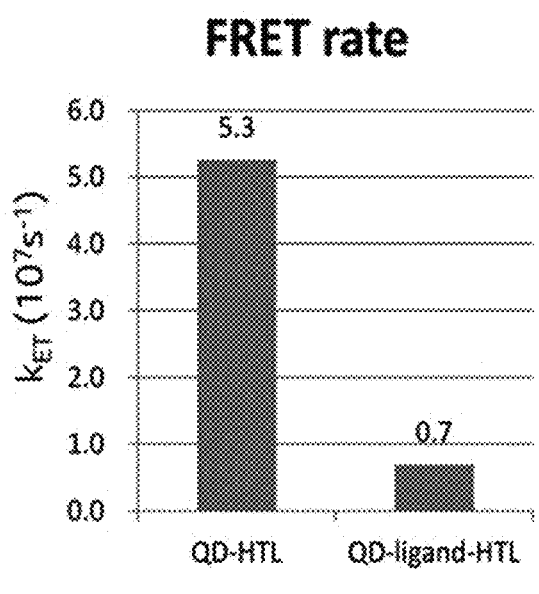
FIG. 6A
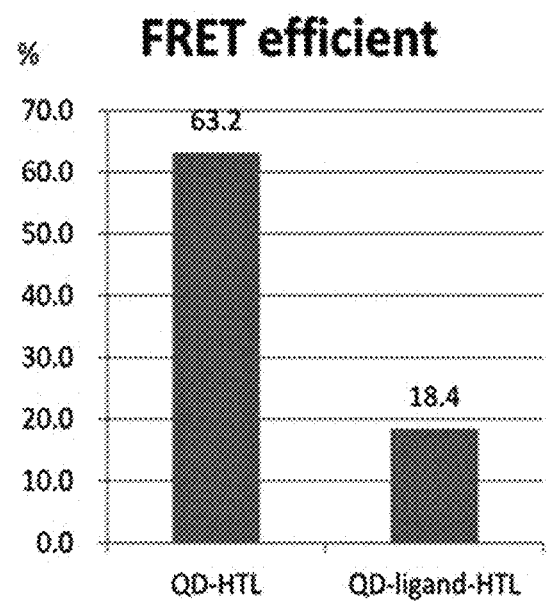
FIG. 6B

QUANTUM DOT LIGHT EMITTING DEVICE AND DISPLAY APPARATUS INCLUDING THE SAME

CROSS REFERENCE TO RELATED APPLICATION

This application claims the priority of Korean Patent Application No. 10-2018-0094938 filed on Aug. 14, 2018, which is hereby incorporated by reference in its entirety.

BACKGROUND

Field of the Disclosure

The present disclosure relates to a display device, and more particularly, to a quantum dot light-emitting device and a display apparatus including the same.

Description of the Background

Quantum dots (QDs) refer to nanometer-sized semiconductor nano-particles, and are characterized by a change in an energy band-gap depending on a size and shape thereof. The quantum dots have a large surface area per unit volume, and most of atoms thereof define surfaces of the nano-particles. The QDs exhibit a quantum confinement effect. The quantum confinement effect may allow a light-emitting wavelength to be controlled only by adjusting a size of the quantum dot. The QDs exhibit excellent color purity and high PL (photoluminescence) emission efficiency.

A quantum dot light-emitting device employing quantum particles such as quantum dots as a material for a light-emitting layer is attracting attention rather than an organic electro-luminescent device. The quantum dot light-emitting device (QD-LED) including a quantum dot-based light-emitting layer has a basic 3-layers stacked structure of a hole transport layer (HTL), the quantum dot-based light-emitting layer, and an electron transport layer (ETL).

SUMMARY

A purpose of the present disclosure is to provide a quantum dot light-emitting device with improved external quantum efficiency and device stability, and a display apparatus including the same.

The purposes of the present disclosure are not limited to the above-mentioned purposes. Other purposes and advantages of the present disclosure, as not mentioned above, may be understood from the following descriptions and more clearly understood from the aspects of the present disclosure. Further, it will be readily appreciated that the objects and advantages of the present disclosure may be realized by features and combinations thereof as disclosed in the claims.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings:

FIG. 5 and FIGS. 6A and 6B show comparison between FRETs under absence and presence of a buffer layer between a quantum dot layer and a hole transport layer. FIG. 5 compares reduction characteristics of PL (photoluminescence) over a decay time. In FIG. 6A shows a FRET rate and FIG. 6B shows a FRET efficiency.

DETAILED DESCRIPTIONS

Figure 1:
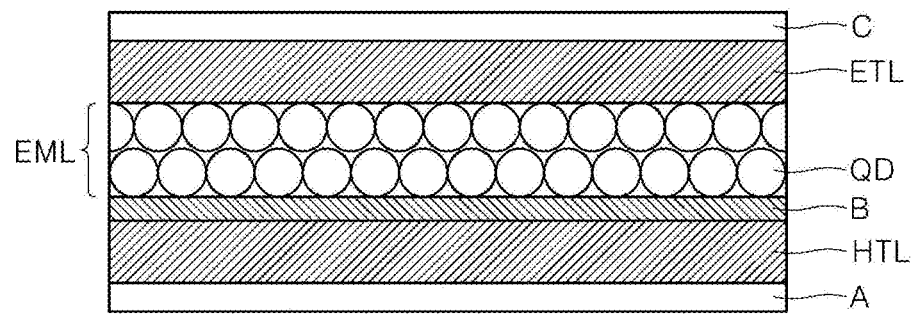
FIG. 1 is a schematic diagram of a quantum dot light-emitting device according to the present disclosure.

Examples of various aspects of the present disclosure are illustrated and described further below. It will be understood that the description herein is not intended to limit the claims to the specific aspects described. On the contrary, it is intended to cover alternatives, modifications, and equivalents as may be included within the spirit and scope of the present disclosure as defined by the appended claims.

For simplicity and clarity of illustration, elements in the figures are not necessarily drawn to scale. The same reference numbers in different figures denote the same or similar elements, and as such perform similar functionality.

Descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "bound to", or "coupled to" another element or layer, it can be directly on, bound to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular aspects only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "Ca to Cb" is defined as a hydrocarbon group or a hydrocarbon derivative group having a inclusive to b inclusive carbon atoms, a and b are natural numbers. As used herein, "a and/or b" means "a or b" or "a and b".

As used herein, in a phrase "substituted or unsubstituted", a term "substituted" means that at least one hydrogen of a hydrocarbon compound or hydrocarbon derivative is substituted with a hydrocarbon group, a hydrocarbon derivative group, a halogen or a cyano group (—CN). A term "unsubstituted" mean that at least one hydrogen of a hydrocarbon compound or a hydrocarbon derivative is unsubstituted with a hydrocarbon group, a hydrocarbon derivative group or a halogen or a cyano group (—CN). Examples of the hydrocarbon group or the hydrocarbon derivative group may include C1 to C6 alkyl, C2 to C6 alkenyl, C2 to C6 alkynyl, C6 to C15 aryl, C1 to C6 alkyl C6 to C15 aryl, C6 to C15 aryl C1 to C6 alkyl, C1 to C6 alkylamino, C6 to C15 arylamino, C1 to C6 alkylidene, and the like. The present disclosure is not limited thereto.

Figure 2:
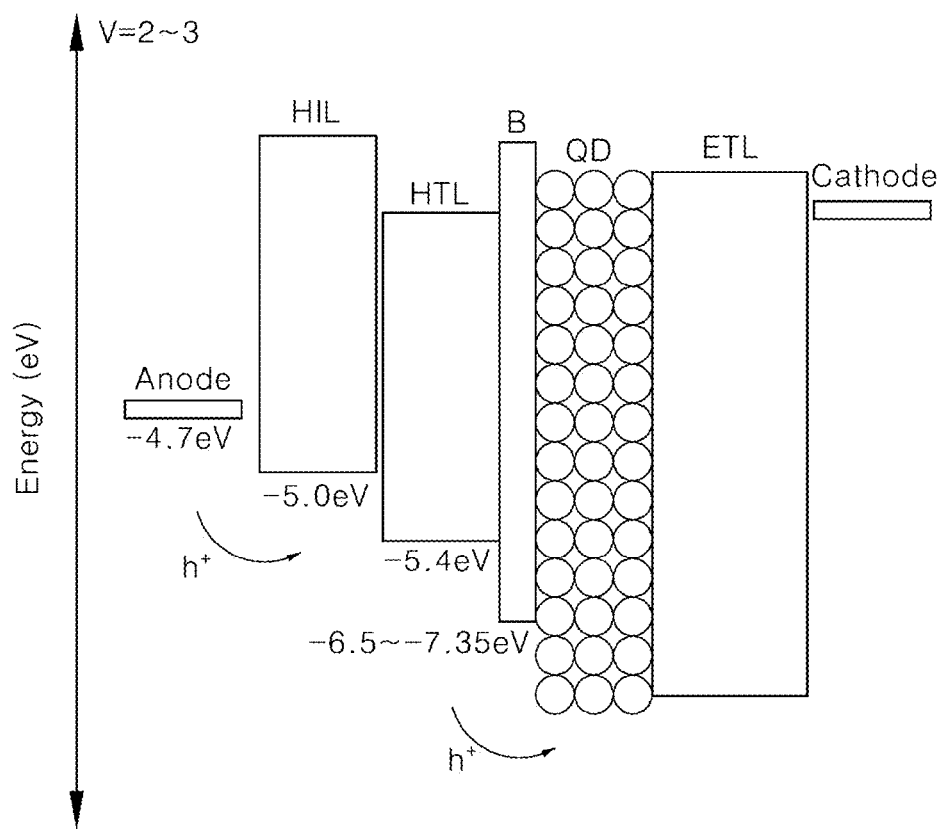
FIG. 2 is a schematic band-gap energy diagram of the quantum dot light-emitting device of FIG. 1.

FIG. 1 is a schematic diagram of a quantum dot light-emitting device 100 according to the present disclosure. FIG. 2 is a schematic band-gap energy diagram of the quantum dot light-emitting device 100 of FIG. 1.

Refer to FIG. 1 and FIG. 2, the quantum dot light-emitting device 100 includes an anode A, a hole transport layer HTL, a buffer layer B, a light-emitting layer EML, and a cathode C. The light-emitting layer EML includes quantum dots QDs, each having a core-shell structure.

The hole transport layer HTL is disposed between the anode A and the cathode C. The light-emitting layer EML is disposed between the hole transport layer HTL and the cathode C. The buffer layer B is disposed between the hole transport layer HTL and the light-emitting layer EML.

Hereinafter, the anode A, the hole transport layer HTL, the light-emitting layer EML, the buffer layer B, and the cathode C will be described in this order.

The anode A may be made of a doped or undoped metal oxide selected from a group consisting of indium-tin-oxide (ITO), indium-tin-zinc-oxide (ITZO), indium-zinc-oxide (IZO), indium-copper-oxide (ICO), indium oxide ($In_2O_3$), tin oxide ($SnO_2$), cadmium:zinc oxide (Cd:ZnO), fluorine:tin oxide ($F:SnO_2$), indium:tin oxide ($In:SnO_2$), gallium:tin oxide ($Ga:SnO_2$), and aluminum:zinc oxide (Al:ZnO; AZO).

The hole transport layer HTL may serve to transport holes from the anode A to the light-emitting layer EML. The hole transport layer HTL may have a single layer structure or a multi-layer structure. The hole transport layer HTL may be made of an inorganic compound or an organic compound.

When the hole transport layer HTL is made of an organic compound, an example of a material of the hole transport layer HTL may include at least one selected from a group consisting of 4,4'-N,N'-dicarbazolyl-biphenyl (CBP), α-NPD, spiro-NPB, N,N'-diphenyl-N,N'-bis(3-ethylphenyl)-(1,1'-biphenyl)-4,4'-diamine (TPD), N,N'-di(4-(N,N'-diphenyl-amino)phenyl)-N,N'-diphenylbenzidine (DNTPD), 4,4',4''-tris(N-carbazolyl)-triphenylamine (TCTA), poly(9-vinylcarbazole) (PVK), and PEDOT:PSS.

When the hole transport layer HTL is made of an inorganic compound, an example of a material of the hole transport layer HTL may include at least one selected from a group consisting of NiO, $MoO_3$, $Cr_2O_3$, CuSCN, $Mo_2S$, $Bi_2O_3$ and combinations thereof.

The light-emitting layer EML contains quantum dots (QDs), each having a core-shell structure that emits red, green, or blue light. The light-emitting layer EML may be configured to emit light of any one of red, green, and blue independently.

The quantum dot (QD) having the core-shell structure includes a core, at least one shell that surrounds the core, and a ligand that surrounds the at least one shell. When there is more than one shell, the ligand encloses an outer shell. The ligand may mean a molecule or an ion that binds to surroundings of a metal ion to form a coordinate bond. The ligand forms a covalent bond with the metal ion, so that the ligand is not ionized in an aqueous solution. When the ligand forms the coordinate bond on a surface of a metal particle or a semiconductor nano particle, a defect existed on the surface of the particle can be stabilized and a shape of the particle can be maintained. Also, dispersion of the particle is enhanced, so that agglomeration between a particle and a particle can be prevented.

An example of a material of each of the core and the shell may include, but is not limited to, a II-VI group compound, a III-V group compound, a IV-VI group compound, a IV group element, a IV group compound, or combinations thereof.

The II-VI group compound may be selected from a group consisting of: a binary element compound selected from a group consisting of CdSe, CdTe, ZnS, ZnSe, ZnTe, ZnO, HgS, HgSe, HgTe, MgSe, MgS and combinations thereof; a ternary element compound selected from a group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and combinations thereof; and a quaternary element compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe and combinations thereof.

The III-V group compound may be selected from a group consisting of: a binary element compound selected from a group consisting of GaN, GaP, GaAs, GaSb, AlN, AlP, AlAs, AlSb, InN, InP, InAs, InSb and combinations thereof; a ternary element compound selected from a group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP and combinations thereof; and a quaternary element compound selected from a group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and combinations thereof.

The IV-VI group compound may be selected from a group consisting of: a binary element compound selected from a group consisting of SnS, SnSe, SnTe, PbS, PbSe, PbTe and combinations thereof; a ternary element compound selected from a group consisting of SnSeS, SnSeTe, SnSTe, PbSeS, PbSeTe, PbSTe, SnPbS, SnPbSe, SnPbTe and combinations thereof; and a quaternary element compound selected from a group consisting of SnPbSSe, SnPbSeTe, SnPbSTe and combinations thereof. The IV group element may be selected from a group consisting of Si, Ge and combinations thereof. The IV group compound may include a binary element compound selected from a group consisting of SiC, SiGe and combination thereof.

The shell has a larger band-gap than the core. As a result, the quantum dots (QD), each having the core-shell structure improve quantum yield (QY) and stability compared to quantum dots, each having a single particle type.

The ligand may include an aliphatic hydrocarbon compound containing a functional group with an unshared electron pair, or derivatives thereof, or an aromatic hydrocarbon compound containing a functional group with an unshared electron pair, or derivatives thereof. For example, the functional group with the unshared electron pair may be selected from a group consisting of a hydroxyl group (—OH), a carboxyl group (—COOH), an amino group (—NR, —NH, —NH$_2$, where R is a C1 to C6 monovalent hydrocarbon group or derivatives thereof) and a thiol group (—SH).

An organic material constituting the ligand may include at least one selected from a group consisting of a substituted or unsubstituted saturated fatty acid, a substituted or unsubstituted unsaturated fatty acid, a substituted or unsubstituted saturated fatty amine, a substituted or unsubstituted unsaturated fatty acid amine, a substituted or unsubstituted C4 to C34 alkanethiol, a substituted or unsubstituted C6 to C34 aromatic thiol and combinations thereof.

An example of the organic material constituting the ligand may include at least one selected from a group consisting of oleic acid, oleylamine, 1-octanethiol, octane-2-thiol, 1-dodecanethiol, dodecane-2-thiol, lauric acid, 2-methylbenzenethiol, 3-methylbenzenethiol, 4-methylbenzenethiol and combinations thereof.

The quantum dots QDs, each having the core-shell structure may have a full width of half maximum (FWHM) of a light-emitting wavelength spectrum of about 45 nm or shorter, about 40 nm or shorter, or about 30 nm or shorter. Color purity and color reproducibility can be improved in this FWHM range.

The quantum dots QDs, each having the core-shell structure may be synthesized by a wet process in which a precursor material is placed in an organic solvent and then particles are grown therein. The quantum dots QDs, each having the core-shell structure, may emit light beams of various wavelengths via varying of an energy band-gap according to a degree of growth of the particles.

The buffer layer B contains an organic compound or derivatives thereof. For example, the buffer layer B may contain an organic compound or derivatives thereof, which function as the ligand. The buffer layer B may contain the organic compound or derivatives thereof same as the ligand. For example, the buffer layer B may be composed of an organic compound or derivatives thereof. For example, the buffer layer B may be composed of an organic compound or derivatives thereof, which function as the ligand. The buffer layer B may be composed of the organic compound or derivatives thereof same as the ligand. When an inorganic material layer instead of the buffer layer B is disposed between the hole transport layer HTL and the light-emitting layer EML, following disadvantages may occur.

Since the inorganic material has a band-gap, the inorganic material is likely to absorb light emitted from the quantum dots QDs, each having the core-shell structure. Thus, a absorption wavelength of the inorganic material overlaps a light-emission wavelength of the quantum dots QDs, each having the core-shell structure, resulting in a fluorescence resonance energy transfer (FRET) phenomenon. Since the organic compound or derivatives thereof constituting the buffer layer B are free of a band-gap, unlike the inorganic material layer, the buffer layer B does not cause the FRET phenomenon.

The inorganic material has the band-gap. Thus, when a LUMO level of the quantum dots QDs of the core-shell structure is similar to a LUMO level of the inorganic material, and even when charges are not intentionally injected, charges may be injected into the quantum dots QDs of the core-shell structure. Since the organic compound or derivatives thereof constituting the buffer layer B are free of a LUMO level, unlike the inorganic material layer, the buffer layer B has no possibility of injection of the charges into the quantum dots QDs of the core-shell structure when charges are not intentionally injected.

Furthermore, an inorganic material such as silicon oxide and titanium oxide as mainly used as an insulator has poor electrical conductivity, thereby deteriorating the light emitting efficiency of the device. To the contrary, the buffer layer B is made of an organic material, which functions as the ligand of the quantum dots QDs of the core-shell structure. Thus, unlike the inorganic material, the organic material has no possibility of lowering the electrical conductivity.

Otherwise, when the buffer layer B is absent, a difference between a HOMO (High Occupied Molecular Orbital) level of the shell of the quantum dot QD of the core-shell structure and a HOMO level of the hole transport layer HTL is large, such that charge imbalance occurs.

A HOMO level of the buffer layer B is present between the HOMO level of the hole transport layer HTL and a HOMO level of the light-emitting layer EML. Thus, the buffer layer B may serve to lower an energy barrier between the hole transport layer HTL and the shells of the quantum dots QDs, each having the core-shell structure. Thus, the buffer layer B may increase the emission efficiency of the quantum dot light-emitting device 100 by lowering the energy barrier between the hole transport layer HTL and the light-emitting layer EML.

A difference between the HOMO level of the hole transport layer HTL and the HOMO level of the shells of the quantum dots QDs, each having the core-shell structure, may be greater than or equal to 2.0 eV. A difference between the HOMO level of the buffer layer B and the HOMO level of the hole transport layer HTL may be smaller than 2.0 eV. For example, the difference between the HOMO level of the buffer layer B and the HOMO level of the hole transport layer HTL may be greater than or equal to 1.1 eV and smaller than 2.0 eV. Further, for example, the HOMO level of the buffer layer B may be in a range of −7.35 eV to −6.5 eV.

The ligand may escape from the shells of the quantum dots QDs, each having the core-shell structure, during a manufacturing process of the device. Due to the escape of the ligand, a balance between positive and negative charges on surfaces of the quantum dots QDs is lost such that a density of the positive charges is higher on the surfaces of the quantum dots QDs that that of the negative charges. As a result, the escape of the ligand causes surface instability of the quantum dots QDs, each having the core-shell structure, thereby degrading the stability of the device.

The organic compound or derivatives thereof function as the ligand of the quantum dot QD of the core-shell structure. The organic compound or derivatives thereof may include an aliphatic hydrocarbon compound having a functional group with an unshared electron pair or derivatives thereof or an aromatic hydrocarbon compound having a functional group with an unshared electron pair or derivatives thereof. For example, the functional group with the unshared electron pair may be selected from a group consisting of a hydroxyl group (—OH), a carboxyl group (—COOH), an amino group (—NR, —NH, —NH$_2$, where R is a C1 to C6 monovalent hydrocarbon group or derivatives thereof) and a thiol group (—SH).

Even when the ligand escapes from the shells of the quantum dots QDs, the positive and negative charge imbalances on the surfaces of the quantum dots QDs having the core-shell structures respectively may be mitigated or eliminated by the functional group with the unshared electron pair. For this reason, the buffer layer B may improve the stability of the quantum dot light-emitting device 100.

The organic compound or derivatives thereof constituting the buffer layer B may include at least one selected from a group consisting of a substituted or unsubstituted saturated fatty acid, a substituted or unsubstituted unsaturated fatty acid, a substituted or unsubstituted saturated fatty amine, a substituted or unsubstituted unsaturated fatty acid amine, a substituted or unsubstituted C4 to C34 alkanethiol, a substituted or unsubstituted C6 to C34 aromatic thiol and combinations thereof.

An example of each of the organic compound or derivatives thereof may include at least one selected from a group consisting of oleic acid, oleylamine, 1-octanethiol, octane-2-thiol, 1-dodecanethiol, dodecane-2-thiol, lauric acid, 2-methylbenzenethiol, 3-methylbenzenethiol, 4-methylbenzenethiol and combinations.

Otherwise, the absorption wavelength of the hole transport layer HTL overlaps with the light-emission wavelength of the quantum dots QDs of the core-shell structure, resulting in FRET phenomenon. This may reduce the external quantum efficiency (EQE) of the quantum dot light-emitting device 100.

In accordance with the present disclosure, the buffer layer B is disposed between the hole transport layer HTL and the light-emitting layer EML. Thus, a distance between the hole transport layer HTL and the light-emitting layer EML, specifically, a distance between the hole transport layer HTL and the quantum dots QDs of the core-shell structure increases. This may reduce FRET phenomenon between the hole transport layer HTL and the light-emitting layer EML. Thus, the buffer layer B may suppress the degradation of the external quantum efficiency by minimizing the FRET phenomenon.

A thickness of the buffer layer B may be in a range of 0.1 nm to 10 nm. When the thickness of the buffer layer B is smaller than 0.1 nm, the FRET phenomenon between the hole transport layer HTL and the light-emitting layer EML may not be minimized or suppressed. When the thickness of the buffer layer B is greater than 10 nm, the charge injection may be degraded.

The cathode C may be made of at least one selected from a group consisting of Ca, Ba, Ca/Al, LiF/Ca, LiF/Al, BaF$_2$/Al, CsF/Al, CaCo$_3$/Al, BaF$_2$/Ca/Al, Al, Mg, Au:Mg or Ag:Mg.

In one example, the quantum dot light-emitting device 100 may further include an electron transport layer ETL that transports electrons to the light-emitting layer EML. The buffer layer B is not disposed between the light-emitting layer EML and the electron transport layer ETL. The electron transport layer ETL is disposed between the light-emitting layer EML and the cathode C. The electron transport layer ETL is in direct contact with the light-emitting layer EML.

Hereinafter, comparative experiments for comparison between Present Examples and Comparative Example showing that the buffer layer B contributes to the performance improvement of the quantum dot light-emitting device 100 will be described. The comparative experiments were carried out using quantum dot light-emitting devices according to Present Examples and a quantum dot light-emitting device according to Comparative Example, which were produced as follows.

Example 1

An ITO substrate was washed with UV ozone, and then a hole injection layer HIL, a hole transport layer HTL, a buffer layer B, a light-emitting layer EML, an electron transport layer ETL and a cathode C are stacked on the ITO substrate in a following process order (a) to (e). Thus, a quantum dot light-emitting device (ITO/HIL/HTL/B/EML/ETL/C) was prepared.

Figure 3:
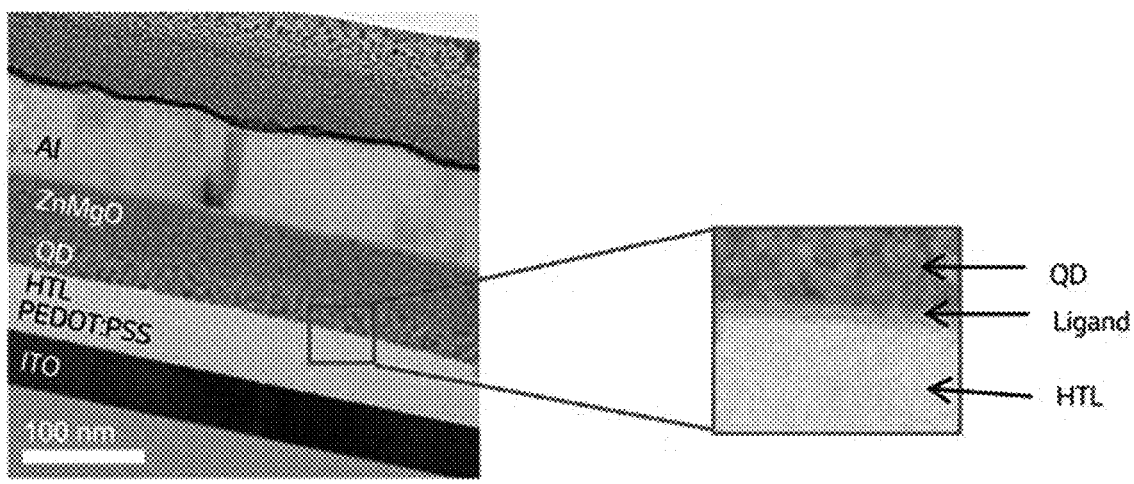
FIG. 3 is a scanning electron microscope (SEM) image of a quantum dot light-emitting device according to one aspect of the present disclosure.

FIG. 3 is a scanning electron microscope (SEM) image of the quantum dot light-emitting device as prepared. FIG. 3 shows that the hole injection layer (PEDOT:PSS), the hole transport layer HTL, the buffer layer (Ligand), the light-emitting layer (QD), the electron transport layer (ZnMgO) and the cathode (Al) are sequentially stacked on the anode (ITO).

(a) The hole injection layer (thickness 25 nm): PEDOT:PSS (Sigma-Aldrich) was used for the hole injection layer. PEDOT:PSS was spin-coated on the ITO substrate, and then was heated and dried at 140° C. for 30 minutes.

(b) The hole transport layer (thickness 25 nm): PVK (Sigma-Aldrich) was used for the hole transport layer. PVK was spin-coated on the hole injection layer and then dried by heating at 210° C. for 40 minutes.

(c) The buffer layer (thickness 2 nm to 3 nm): oleic acid (OA) (Sigma-Aldrich) was used for the buffer layer. Oleic acid was spin-coated on the hole transport layer and then dried by heating at 100° C. for 20 minutes.

(d) The light-emitting layer (thickness 25 nm): Quantum dots (Sigma-Aldrich), each having a core (ZnSe)-shell (ZnS) structure, were used for the light emission layer. The quantum dots having the core-shell structure were spin-coated on the buffer layer.

(e) The electron transport layer (thickness 40 nm): ZnMgO (Sigma-Aldrich) was used for the electron transport layer. ZnMgO was spin-coated on the light-emitting layer.

(f) The cathode (thickness 500 Å): Al was used for the cathode. Al was deposited on the electron transport layer.

Example 2

A quantum dot light-emitting device was fabricated in the same manner as in Present Example 1 except that oleylamine (OLA) (Sigma-Aldrich) was used as the buffer layer material.

Example 3

A quantum dot light-emitting device was fabricated in the same manner as in Present Example 1 except that 4-methylbenzenethiol (MBT) (Sigma-Aldrich) was used as the buffer layer material.

Example 4

A quantum dot light-emitting device was fabricated in the same manner as in Present Example 1 except that 1-dodecanethiol (DDT) (Sigma-Aldrich) was used as the buffer layer material.

Example 5

A quantum dot light-emitting device was fabricated in the same manner as in Present Example 1 except that lauric acid (LA) (Sigma-Aldrich) was used as the buffer layer material.

Comparative Example 1

A quantum dot light-emitting device was fabricated in the same manner as in Present Example 1 except that no buffer layer was formed.

HOMO levels of oleic acid (OA), oleylamine (OLA), 4-methylbenzenethiol (MBT), 1-dodecanethiol (DDT) and lauric acid (LA) were measured by ultraviolet photoelectron spectroscopy respectively.

Analysis equipment: PHI 5000 VersaProbe (ULVAC PHI)
Sample preparation: A 2 wt % oleic acid (OA) ethanol solution was spin-coated on a 2 cm×2 cm ITO glass to prepare a present sample 1. A 2 wt % oleylamine (OLA) ethanol solution was spin-coated on a 2 cm×2 cm ITO glass to prepare a present sample 2. A 2 wt % 4-methylbenzenethiol (MBT) ethanol solution was spin coated on a 2 cm×2 cm ITO glass to prepare a present sample 3. A 2 wt % 1-dodecanethiol (DDT) ethanol solution was spin-coated on a 2 cm×2 cm ITO glass to prepare a present sample 4. A 2 wt % lauric acid (LA) ethanol solution was spin-coated on a 2 cm×2 cm ITO glass to prepare a present sample 5.

Table 1 summarizes the HOMO levels of ITO, PEDOS:PSS, PVK, OA, OLA, MBT, DDT and LA.

TABLE 1

|  | HOMO level (eV) |
| --- | --- |
| ITO | −4.7 |
| PEDOT:PSS | −5.0 |
| PVK | −5.4 |
| OA | −7.28 |
| OLA | −7.35 |
| MBT | −6.58 |
| DDT | −6.96 |
| LA | −7.28 |

Experimental Example 1—Evaluation of EQE by Buffer Layer

Using the quantum dot light-emitting devices obtained from Present Examples 1 to 5 and the quantum dot light-emitting device obtained from the Comparative Example 1, the external quantum efficiency (EQE), luminance, voltage, color coordinates, FWHM and Wp were evaluated depending on the absence or presence of the buffer layer. Measurement results thereof are summarized in Table 2 below.

TABLE 2

|  | EQE (%) | Luminance (Cd/m$^2$) | Voltage (V) | Wp | FWHM | Color coordinate CIE (x, y) |
| --- | --- | --- | --- | --- | --- | --- |
| Comparative Example 1 | 1.51 | 42.62 | 4.43 | 436 | 19 | 0.163, 0.022 |
| Present Example 1 | 8.31 | 203.2 | 4.24 | 436 | 19 | 0.163, 0.022 |
| Present Example 2 | 7.74 | 201.0 | 4.31 | 436 | 19 | 0.163, 0.022 |
| Present Example 3 | 7.95 | 202.7 | 4.20 | 436 | 19 | 0.163, 0.022 |
| Present Example 4 | 7.62 | 181.2 | 4.31 | 436 | 19 | 0.163, 0.022 |
| Present Example 5 | 7.45 | 194.2 | 4.33 | 436 | 19 | 0.163, 0.022 |

Referring to Table 2, each of the quantum dot light-emitting devices of Present Examples 1 to 5 has significantly improved external quantum efficiency (EQE) and luminance and low voltage driving characteristics, compared to the quantum dot light-emitting device of Comparative Example 1.

Experimental Example 2—Device Stability Evaluation

Using the quantum dot light-emitting devices obtained from Present Examples 1 to 5 and the quantum dot light-emitting devices obtained from the Comparative Example 1, we evaluated device stability based on the absence or presence of the buffer layer.

Figure 4:
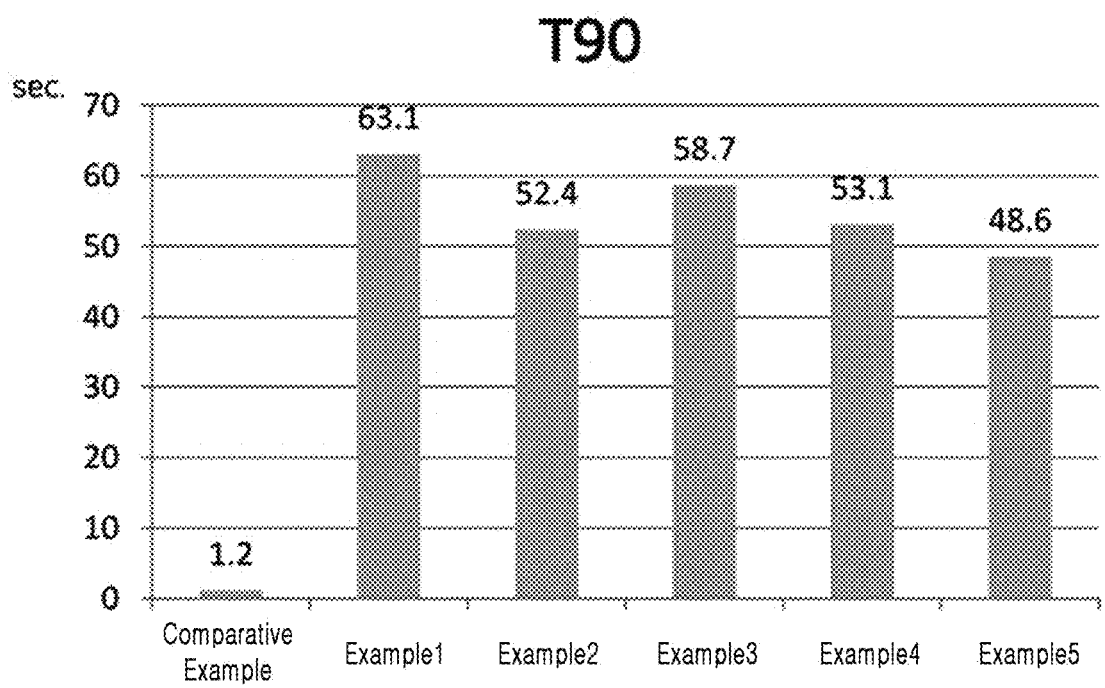
FIG. 4 is a graph for comparing lifespan characteristics between quantum dot light-emitting devices according to Present Examples of the present disclosure and a quantum dot light-emitting device according to a Comparative Example.

FIG. 4 is a graph for comparing lifespan (T90) characteristics of the quantum dot light-emitting devices according to Present Examples 1 to 5 and the quantum dot light-emitting device according to Comparative Example 1. Referring to FIG. 4, the lifespan (T90) characteristic of each of the quantum dot light-emitting devices of Present Examples 1 to 5 is greatly improved compared to that of the quantum dot light-emitting device of Comparative Example 1.

Experimental Example 3—FRET Reduction Evaluation

The quantum dot layer QD, the buffer layer (Ligand) and the hole transport layer HTL were sequentially spin-coated on a glass in order to prepare a present sample (QD-Ligand-HTL). The quantum dot layer QD and the hole transport layer HTL were sequentially spin-coated onto a glass to prepare a comparative sample (QD-HTL).

Then, change of the FRET phenomenon according to absence and presence of the buffer layer was evaluated using Quanturus-Tau (Hamamtchu, C11367-31).

FIG. 5 is a graph for comparing reduction characteristics of PL (photoluminescence) over a decay time. Referring to FIG. 5, the present sample (QD-ligand-HTL) was reduced in the FRET compared to the comparative sample (QD-HTL).

In FIG. 6A is about the FRET rate. In FIG. 6B is about the FRET efficiency. Referring to FIGS. 6A and 6B, the present sample (QD-ligand-HTL) had lower FRET rate and lower FRET efficiency than those of the comparative sample (QD-HTL).

On the other hand, the present disclosure also provides a display apparatus including the quantum dot light-emitting device as described above.

While the aspects have been described with reference to the accompanying drawings, it is to be understood that the present disclosure is not limited to the aspects, but may be embodied in various forms via combinations of features of the aspects. Those of ordinary skill in the art to which the present disclosure pertains may understand that the present disclosure may be embodied in other specific forms without departing from the spirit or essential characteristics of the present disclosure. It is to be understood, therefore, that the aspects as described above are in all respects illustrative and not restrictive.

What is claimed is:

1. A quantum dot light-emitting device, comprising:
   an anode;
   a cathode;
   a hole transport layer disposed between the anode and the cathode;
   a light-emitting layer disposed between the hole transport layer and the cathode, the light-emitting layer including a quantum dot having a core-shell structure; and
   a buffer layer disposed between the hole transport layer and the light-emitting layer,
   wherein the buffer layer includes an organic compound or derivatives thereof, and
   wherein the organic compound or the derivatives thereof includes an aliphatic hydrocarbon compound having a functional group with an unshared electron pair or derivatives thereof, or an aromatic hydrocarbon compound having a functional group with an unshared electron pair or derivatives thereof.

2. The quantum dot light-emitting device of claim 1, wherein the quantum dot includes a core, at least one shell that surrounds the core and a ligand that surrounds the at least one shell.

3. The quantum dot light-emitting device of claim 2, wherein the buffer layer includes the ligand.

4. The quantum dot light-emitting device of claim 1, wherein the organic compound or the derivatives thereof include:
   an aliphatic hydrocarbon compound or derivatives thereof having a functional group selected from a group consisting of a hydroxyl group (—OH), a carboxyl group (—COOH), an amino group (—NR, —NH, —NH2, where R is a C1 to C6 monovalent hydrocarbon group or derivatives thereof) and a thiol group (—SH); or
   an aromatic hydrocarbon compound or derivatives thereof having a functional group selected from a group consisting of a hydroxyl group (—OH), a carboxyl group (—COOH), an amino group (—NR, —NH, —NH2, where R is a C1 to C6 monovalent hydrocarbon group or derivatives thereof) and a thiol group (—SH).

5. The quantum dot light-emitting device of claim 4, wherein the organic compound or the derivatives thereof includes at least one selected from the group consisting of a substituted or unsubstituted saturated fatty acid, a substituted or unsubstituted unsaturated fatty acid, a substituted or unsubstituted saturated fatty amine, a substituted or unsubstituted unsaturated fatty acid amine, a substituted or unsubstituted C4 to C34 alkanethiol, a substituted or unsubstituted C6 to C34 aromatic thiol and combinations thereof.

6. The quantum dot light-emitting device of claim 5, wherein the organic compound or derivatives thereof includes at least one selected from the group consisting of oleic acid, oleylamine, 1-octanethiol, octane-2-thiol, 1-dodecanethiol, dodecane-2-thiol, lauric acid, 2-methylbenzenethiol, 3-methylbenzenethiol, 4-methylbenzenethiol and combinations thereof.

7. The quantum dot light-emitting device of claim 1, wherein a HOMO level of the buffer layer is present between a HOMO level of the hole transport layer and a HOMO level of the light-emitting layer.

8. The quantum dot light-emitting device of claim 7, wherein a difference between the HOMO level of the buffer layer and the HOMO level of the hole transport layer is smaller than 2.0 eV.

9. The quantum dot light-emitting device of claim 8, wherein the difference between the HOMO level of the buffer layer and the HOMO level of the hole transport layer is greater than or equal to 1.1 eV and smaller than 2.0 eV.

10. The quantum dot light-emitting device of claim 7, wherein the HOMO level of the buffer layer is in a range of −7.35 eV to −6.5 eV.

11. The quantum dot light-emitting device of claim 1, wherein a thickness of the buffer layer is in a range of 0.1 nm to 10 nm.

12. The quantum dot light-emitting device of claim 1, further comprising an electron transport layer disposed between the light-emitting layer and the cathode, wherein the electron transport layer is in direct contact with the light-emitting layer.

13. A quantum dot light-emitting device, comprising:
   an anode;
   a cathode;
   a hole transport layer disposed between the anode and the cathode;
   a light-emitting layer disposed between the hole transport layer and the cathode, the light-emitting layer including a quantum dot having a core-shell structure;
   an electron transport layer disposed between the light-emitting layer and the cathode, the electron transport layer directly in contact with the light-emitting layer; and
   a buffer layer disposed between the hole transport layer and the light-emitting layer,
   wherein the buffer layer includes an organic compound or derivatives thereof and functions as a ligand, and
   wherein the organic compound or the derivatives thereof includes an aliphatic hydrocarbon compound having a functional group with an unshared electron pair or derivatives thereof, or an aromatic hydrocarbon compound having a functional group with an unshared electron pair or derivatives thereof.

14. The quantum dot light-emitting device of claim 13, wherein the organic compound or the derivatives thereof includes at least one selected from the group consisting of a substituted or unsubstituted saturated fatty acid, a substituted or unsubstituted unsaturated fatty acid, a substituted or unsubstituted saturated fatty amine, a substituted or unsubstituted unsaturated fatty acid amine, a substituted or unsubstituted C4 to C34 alkanethiol, a substituted or unsubstituted C6 to C34 aromatic thiol and combinations thereof.

15. The quantum dot light-emitting device of claim 14, wherein the organic compound or derivatives thereof includes at least one selected from the group consisting of oleic acid, oleylamine, 1-octanethiol, octane-2-thiol, 1-dodecanethiol, dodecane-2-thiol, lauric acid, 2-methylbenzenethiol, 3-methylbenzenethiol, 4-methylbenzenethiol and combinations thereof.

16. The quantum dot light-emitting device of claim 13, wherein a HOMO level of the buffer layer is present between a HOMO level of the hole transport layer and a HOMO level of the light-emitting layer.

17. The quantum dot light-emitting device of claim 16, wherein a difference between the HOMO level of the buffer layer and the HOMO level of the hole transport layer is smaller than 2.0 eV.

* * * * *